US008232207B2

(12) United States Patent
Ogasawara et al.

(10) Patent No.: US 8,232,207 B2
(45) Date of Patent: Jul. 31, 2012

(54) SUBSTRATE PROCESSING METHOD

(75) Inventors: Kosuke Ogasawara, Sendai (JP); Kiyohito Ito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 12/647,206

(22) Filed: Dec. 24, 2009

(65) Prior Publication Data

US 2010/0167549 A1 Jul. 1, 2010

Related U.S. Application Data

(60) Provisional application No. 61/163,545, filed on Mar. 26, 2009.

(30) Foreign Application Priority Data

Dec. 26, 2008 (JP) ................................ 2008-332374

(51) Int. Cl.
*H01L 21/302* (2006.01)
*H01L 21/461* (2006.01)

(52) U.S. Cl. ........ 438/689; 438/706; 438/707; 438/712; 438/714; 438/719

(58) Field of Classification Search ........................ None
See application file for complete search history.

(56) References Cited

U.S. PATENT DOCUMENTS 6,547,977 B1 4/2003 Yan et al.
6,833,325 B2 * 12/2004 Huang et al. .................. 438/714
2001/0051439 A1 * 12/2001 Khan et al. ..................... 438/710
2004/0132312 A1 * 7/2004 Panda et al. ................... 438/710

FOREIGN PATENT DOCUMENTS

JP 2002-510878 4/2002
JP 2003-56617 2/2003

* cited by examiner

*Primary Examiner* — Duy Deo

(74) *Attorney, Agent, or Firm* — Oblon, Spivak, McClelland, Maier & Neustadt, L.L.P.

(57) ABSTRACT

In a substrate processing method of processing a substrate that includes an oxide layer as a mask layer and a silicon layer as a target layer to be processed, the silicon layer is etched while depositing a deposit on a surface of the oxide layer by a plasma generated from a mixed gas of a fluorine-based gas, a bromine-based gas, $O_2$ gas, and $SiCl_4$ gas to secure a thickness of the mask layer.

12 Claims, 5 Drawing Sheets

74
72
71

SUBSTRATE PROCESSING METHOD

FIELD OF THE INVENTION

The present invention is directed to a substrate processing method, and particularly, to a substrate processing method for performing an etching process on a silicon layer of a substrate to form a deep trench therein.

BACKGROUND OF THE INVENTION

At the recent request of high-density, high-integration semiconductor devices, it is required to form holes or trenches of a high aspect ratio (hereinafter, simply referred to as "deep trench (DT)").

When forming deep trenches on a silicon (Si) layer by etching using plasma, for example, an oxide layer is used as a mask layer. In such an etching process of the silicon layer, increase in etching rate ("ER") of the silicon layer causes increase in ER of the oxide layer. For this reason, selectivity of etching of the silicon layer can be enhanced and the remaining oxide layer becomes a rate limiting factor. Accordingly, it is impossible to obtain a sufficient etching depth. It was because etching of the silicon is impossible without the mask layer.

For example, Japanese Patent Application Publication No. 2003-056617 suggests a conventional etching technology employing a silicon layer as a target layer. In Japanese Patent Application Publication No. 2003-056617, there is disclosed a method of etching a silicon layer as a target object to form high-aspect ratio holes or trenches on the silicon layer, wherein HBr gas, $O_2$ gas, and SiF gas are used as processing gases, and first high-frequency power of a first frequency and second high-frequency power of a second frequency are applied to a lower electrode for mounting the target object thereon in a substrate processing chamber.

However, the above-mentioned conventional technique fails to provide a satisfactory selectivity in etching the silicon layer with respect to the oxide layer.

In view of the above the present invention provides a substrate processing method for etching a silicon layer, which can enhance selectivity of etching the silicon layer with respect to an oxide layer serving as a mask layer.

SUMMARY OF THE INVENTION

In accordance with a first aspect of the invention, there is provided a substrate processing method of processing a substrate that includes an oxide layer as a mask layer and a silicon layer as a target layer to be processed, the method including: etching the silicon layer while depositing a deposit on a surface of the oxide layer by a plasma generated from a mixed gas of a fluorine-based gas, a bromine-based gas, $O_2$ gas, and $SiCl_4$ gas to secure a thickness of the mask layer.

In accordance with a second aspect of the invention, there is provided a substrate processing method of processing a substrate that includes an oxide layer as a mask layer and a silicon layer as a target layer to be processed, the method including: an etching step of etching the silicon layer by a plasma generated from a mixed gas of a fluorine-based gas, a bromine-based gas, and $O_2$ gas; and a deposition step of depositing a deposit on a surface of the oxide layer by a plasma generated from a mixed gas of a bromine-based gas, $O_2$ gas, and $SiCl_4$ gas, wherein the etching step and the deposition step are alternately repeatedly performed.

BRIEF DESCRIPTION OF THE DRAWINGS

The above features of the present invention will become apparent from the following description of an embodiment given in conjunction with the accompanying drawing, in which.

DETAILED DESCRIPTION OF THE EMBODIMENTS

Hereinafter, embodiments of the present invention will be described in greater detail with reference of accompanying drawings.

First of all, there will be described a substrate processing system for performing a substrate transfer method according to embodiments of the present invention. The substrate processing system includes a plurality of processing modules, each of which performs an etching process or ashing process on a semiconductor wafer (hereinafter, simply referred to as "wafer") as a substrate by using a plasma.

Figure 1:
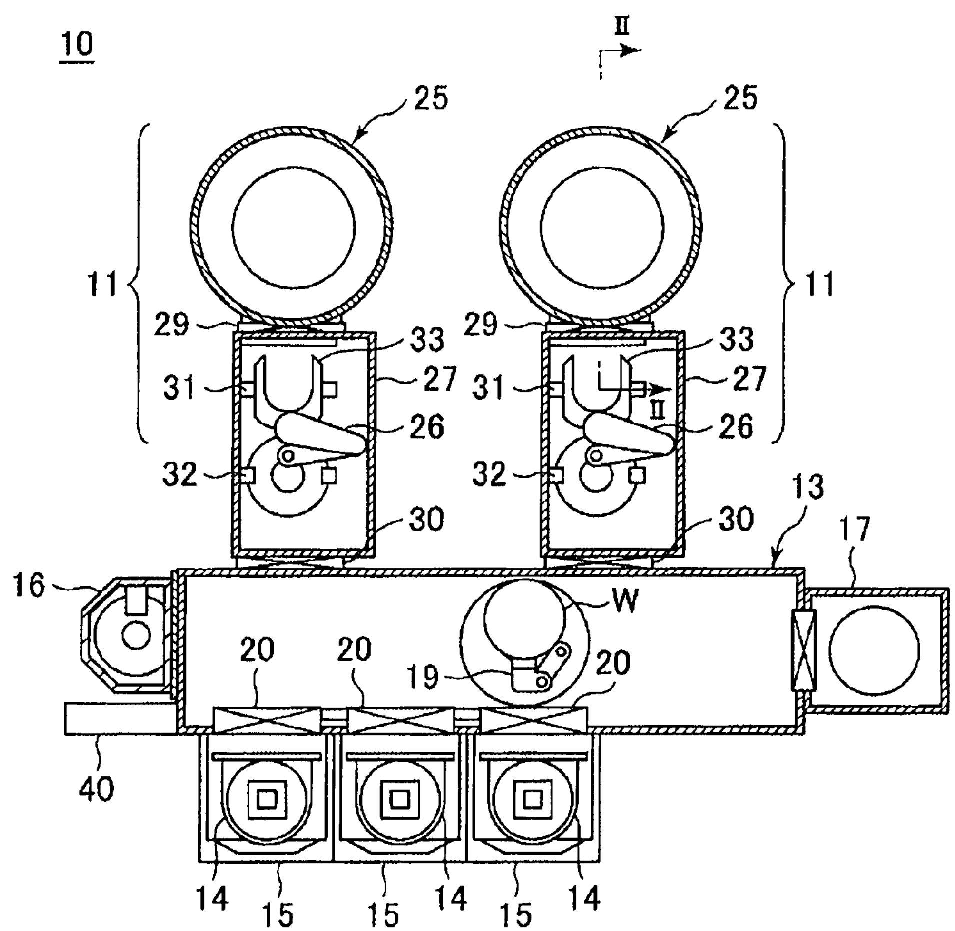
FIG. 1 is a plan view schematically illustrating a configuration of a substrate processing system that performs a substrate processing method according to an embodiment of the present invention.

FIG. 1 is a plan view schematically illustrating a configuration of a substrate processing system that performs a substrate processing method according to the embodiment of the present invention.

Referring to FIG. 1, the substrate processing system includes two process ships 11 and a waiting transfer chamber 13 (hereinafter, referred to as "loader module"). Each process ship functions as a substrate processing apparatus to perform an RIE process on a wafer W as a target substrate. The two process ships 11 are respectively connected to the loader module 13. The loader module 13 has a substantially rectangular shape in section and serves as a common transfer chamber.

Besides the process ships 11, three FOUP ("Front Opening Unified Pod") mounting tables 15, an orienter 16, and an after-treatment chamber 17 are connected to the loader module 13 as well. A FOUP 14, which is a substrate receiving vessel for receiving, e.g., 25 wafers W therein, is mounted in each FOUP mounting table 15. The orienter 16 pre-aligns the position of the wafer W unloaded from the FOUP 14. The after-treatment chamber 17 performs an after-treatment on the wafer that has been subjected to a RIE process.

The two process ships 11 are connected to a lengthwise side wall of the loader module 13, and the three FOUP mounting tables 15 are connected to the other lengthwise wall of the loader module 13, with the loader module 13 located between the process ships 11 and the FOUP mounting tables 15. The orienter 16 is disposed at a longitudinal end portion of the loader module 13 and the after-treatment chamber 17 is disposed at the other longitudinal end portion of the loader module 13.

The loader module 13 includes a SCARA type dual-arm transfer arm 19 and three load ports 20. The transfer arm serves as a substrate transfer unit that transfers a wafer W arranged in the loader module 13. The load ports 20 are arranged at a side wall of the loader module 13 correspondingly to the respective FOUP mounting tables 15. Each load port 20 includes an opening/closing door. The transfer arm 19 takes out the wafer W from the FOUP 14 mounted on the FOUP mounting table 15 via the load port 20, and transfers the taken wafer W between the loader module 13 and the process ship 11, the orienter 16 or the after-treatment chamber 17.

The process ship 11 includes a process module 25 and a load-lock module 27. The process module 25 serves as a vacuum process chamber that performs a RIE process on the wafer W. The load-lock module 27 includes a link-shaped single pick type transfer arm 26 for transferring the wafer W to and from the process module 25.

The process module 25 includes a cylindrical processing vessel (hereinafter, referred to as "chamber"), and an upper electrode and a lower electrode arranged in the chamber, wherein the distance between the upper electrode and the lower electrode is set properly to conduct the RIE process on the wafer W. Further, the lower electrode includes at its top portion an electrostatic chuck (ESC) for chucking a wafer W, for example, by a coulomb force.

A process gas, such as a fluorine-based gas, bromine-based gas or the like, is introduced into the chamber of the process module 25, and converted into plasma by generating an electric field between the upper electrode and the lower electrode. Accordingly, ions and radicals are generated and used to perform the RIE process on the wafer W, thereby etching, for example, a polysilicon layer of the wafer W.

While the inside of the loader module 13 of the process ship 11 is maintained at atmospheric pressure, the inside of the process module 25 is maintained in a vacuum. Accordingly, the load-lock module 27 includes a vacuum gate valve 29 at a portion that is connected to the process module 25 and an atmospheric gate valve 30 at a portion that is connected to the loader module 13. Thus, the load lock module 27 is configured as a vacuum preliminary transfer chamber whose inner pressure can be controlled.

The load lock module 27 includes therein a transfer arm 26, a first buffer 31, and a second buffer 32. The transfer arm 26 is located at a substantially central portion of the load lock module 27, the first buffer 31 at a portion closer to the process module 25 than the transfer arm 26, and the second buffer 32 at a portion closer to the loader module 13 than the transfer arm 26. The first buffer 31 and the second buffer 32 are arranged on a trajectory along which a pick 33 moves. The pick 33 is located at a leading end portion of the transfer arm 26 to hold the wafer W. By shunting a RIE-treated wafer W temporarily to an upper side of the trajectory of the pick 33, exchange between the RIE-treated wafer W and a wafer W which has not been RIE-treated in the process module 25 can be facilitated.

The substrate processing system 10 further includes a system controller (not shown) and an operation controller 40 that is arranged at a longitudinal end portion of the loader module 13. The system controller controls the operation of the process ship 11, the loader module 13, the orienter 16, and the after-treatment chamber 17 (hereinafter, each referred to as "each component").

The system controller controls the operation of each component according to a recipe, i.e., a program, corresponding to a transfer process of the wafer W, or the RIE process. The operation controller 40 includes a state displaying unit, such as LCD (Liquid Crystal Display), which displays operational conditions of each component.

Figure 2:
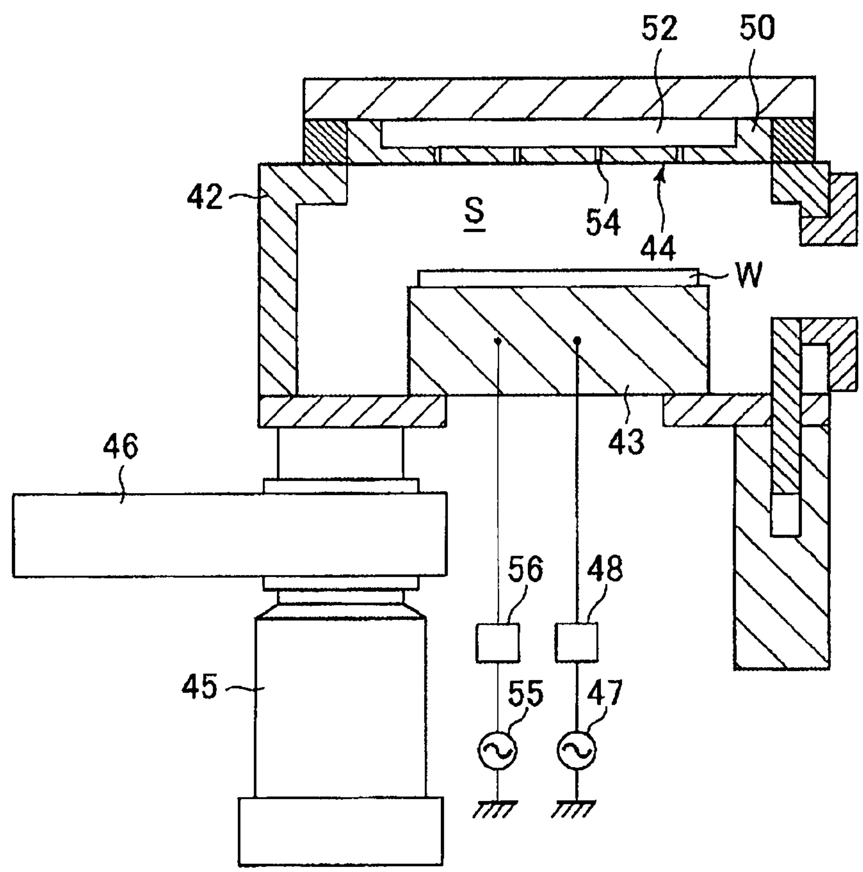
FIG. 2 is a cross sectional view taken along line II-II shown in FIG. 1.

FIG. 2 is a cross sectional view taken along line II-II in FIG. 1.

Referring to FIG. 2, the process module 25 includes the chamber 42, a mounting table 43 for mounting a wafer W thereon, the mounting table 43 being arranged in the chamber 42, a shower head 44 arranged at an upper portion of the chamber 42 to face the mounting table 43, a TMP (Turbo Molecular Pump) 45 for exhausting a gas from the chamber 42, an APC (Adaptive Pressure Control) valve 46 as a variable butterfly valve arranged between the chamber 42 and the TMP 45 to control the pressure inside the chamber 42.

A first high-frequency power supply 47 and a second high-frequency power supply 55 are connected to the mounting table 43 via a first matcher 48 and a second matcher 56, respectively. The first high-frequency power supply 47 applies high-frequency power of a relatively high frequency, e.g., 40 MHz, to the mounting table 43 as excitation electric power, and the second high-frequency power supply applies high-frequency power of a relatively low frequency, e.g., 3.2 MHz, to the mounting table 43 as bias electric power. Accordingly, the mounting table 43 serves as a lower electrode that applies high-frequency power to a processing space S between the mounting table 43 and the shower head 44. The matchers 48 and 56 reduce reflection of high-frequency power from the mounting table 43 to maximize efficiency of supplying high-frequency power to the mounting table 43.

The shower head 44 is formed of a disc-shaped gas supply unit 50 that includes a buffer chamber 52. The buffer chamber 52 includes gas injection holes 54 to communicate with the inside of the chamber 42.

The buffer chamber 52 is connected to gas supply systems (not shown) for supplying, for example, a fluorine-based gas, a bromine-based gas, an oxygen-based gas, and the like. A fluorine-based gas supply system (not shown) supplies $NF_3$ gas to the buffer chamber 52, a bromine-based gas supply system (not shown) supplies HBr gas to the buffer chamber 52. Further, an oxygen-based gas supply system (not shown) supplies $O_2$ gas to the buffer chamber 52. $NF_3$ gas, HBr gas, and $O_2$ gas are supplied to the chamber 42 via the gas injection holes 54.

As described above, the high-frequency power is applied to the processing space S via the mounting table 43 in the chamber 42 of the process module 25 to convert processing gases supplied from the shower head 44 to the processing space S into high-density plasma, and resultant ions and/or radicals, by which an etching process is performed on a silicon layer.

Figure 3:
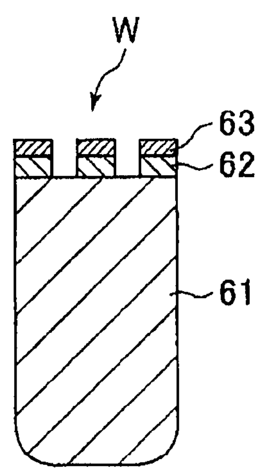
FIG. 3 is a cross section view schematically illustrating a construction of a semiconductor wafer that is subjected to a plasma process in the substrate processing system as shown in FIG. 1.

FIG. 3 is a cross section view schematically illustrating a construction of a semiconductor wafer that is subjected to a plasma process in the substrate processing system as shown in FIG. 1.

Referring to FIG. 3, a wafer W primarily includes a silicon base 61, an $SiO_2$ layer 62 formed on the silicon base 61, and a resist layer 63 formed on the $SiO_2$ layer 62. The resist layer 63 has a hole pattern or trench pattern formed by photolithography. In the wafer configured as above, the $SiO_2$ layer 62 is etched by using the resist layer 63 as a mask to have a hole pattern or the like corresponding to that of the resist layer 63, and then the resist layer 63 is removed. By doing so, the $SiO_2$ layer 62 may serve as a mask layer to etch the silicon base 61.

By using a processing gas including a fluorine-based gas, a bromine-based gas, and an oxygen-based gas, an etching process is performed on the wafer W that includes the silicon base 61 and the $SiO_2$ layer 62 patterned corresponding to the hole pattern of the resist layer 63, so that a deep trench (DT) of a high aspect ratio is formed on the silicon base 61.

To satisfy needs of small semiconductor devices, it is necessary to stably form a DT having a stable opening shape and a high aspect ratio on the silicon base 61, a target layer. However, an increase in the etching rate (hereinafter, referred to as "ER") of the silicon base 61 results in an increase in the ER of the $SiO_2$ layer 62 which serves as a mask layer, thus making it difficult to improve selectivity in the etching of the silicon base 61.

To find out a method of improving selectivity in the etching of a silicon layer to acquire a sufficient etching depth and stably forming a DT having a high aspect ratio and a stable opening shape, the present inventors made various experiments. While using as a processing gas a mixed gas of a fluorine-based gas, a bromine-based gas, an oxygen-based gas, and $SiCl_4$ gas to generate a plasma, etching was performed by using the plasma of the mixed gas. Accordingly, the etching of the silicon base 61 could be performed while forming deposits on a surface of the $SiO_2$ layer 62 serving as a mask layer and securing a film thickness for the mask layer (deposition etching step). By doing so, the present inventors have found that in the etching of the silicon layer, ER and selectivity could be enhanced and DT of a high aspect ratio could be achieved. The present invention has been made in this point of view.

A substrate processing method according to an embodiment of the present invention will now be described in detail.

This substrate processing method includes a deposition etching step. In the deposition etching step, deposits are formed on the top surface of the $SiO_2$ layer 62 serving as a mask layer on the basis of a plasma process to suppress abrasion of the mask layer. Accordingly, the silicon base 61 as a target layer is etched to form a DT on the silicon base 61 while securing a film thickness of the mask layer.

Figure 4A:
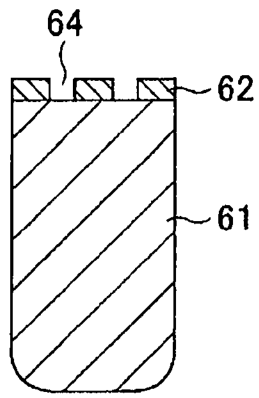
FIGS. 4A, 4B, and 4C depict processes of a substrate processing method according to an embodiment.
Figure 4B:
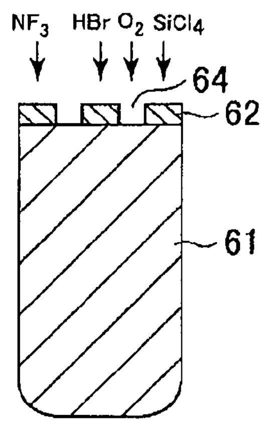
Figure 4C:
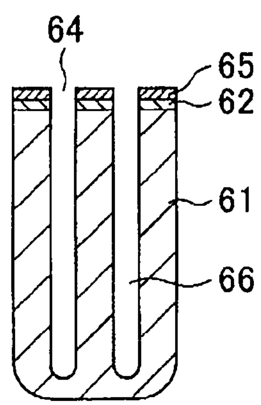

FIGS. 4A, 4B, and 4C depict processes of the substrate processing method according to the present embodiment.

Referring to FIG. 4A, a wafer W is prepared that includes a silicon layer 61 serving as a target layer and an $SiO_2$ layer 62 serving as a mask layer. On the $SiO_2$ layer 62 are formed openings 64, each having the width of, e.g., about 80 nm. The thickness of the $SiO_2$ layer 62 ranges from about 1000 nm to 1500 nm for example. The wafer W is loaded in the chamber 42 of the process module 25 (refer to FIG. 2) and mounted on the mounting table 43 in the substrate processing system shown in FIG. 1.

Subsequently, the pressure inside the chamber 42 is set to, for example, about 170 mTorr (2.26×10 Pa) to 250 mTorr (3.33×10 Pa), by the APC valve 46 or the like. Here, mTorr is equal to $10^{-3}$×101325/760 Pa (this applies throughout the specification). The temperature of the wafer W is set to, for example, about 90° C. And, a mixed gas of a fluorine-based gas, e.g., $NF_3$ gas, a bromine-based gas, e.g., HBr gas, $O_2$ gas, and $SiCl_4$ gas, is supplied from the gas supply unit 50 of the shower head 44 into the chamber 42. In this case, the flow rates of $NF_3$ gas, HBr gas, $O_2$ gas, $SiCl_4$ gas are respectively about 120 sccm, 700 sccm, 163 sccm, 10 sccm. Here, 1 sccm is a unit of flow rate, and 1 sccm is equal to $10^{-6}/60/m^3/sec$ (this applies throughout the specification).

Then, excitation electric power of 500 W and bias electric power of 2500 W are applied to the mounting table 43. $NF_3$ gas, HBr gas, $O_2$ gas, and $SiCl_4$ gas are excited by the high-frequency power applied to the processing space S to be converted into plasma, thus generating ions and/or radicals as shown in FIG. 4B. As shown in FIG. 4C, the ions and/or radicals collide and react with the surface of the $SiO_2$ layer 62 to abrade the $SiO_2$ layer 62 and simultaneously form deposits 65 on the $SiO_2$ layer 62. Further, the ions and/or radicals collide with the silicon base 61 not covered by the $SiO_2$ layer 62 to etch the silicon base 61, thus forming DTs 66 in the silicon base 61 while securing a film thickness of the $SiO_2$ layer 62.

The deposit 65 are deposited on the surface of the $SiO_2$ layer 62 to protect the $SiO_2$ layer 62 serving as a mask layer. The deposits 65 are etched out together with the silicon base 61 by the generated plasma, so that the total thickness of the $SiO_2$ layer 62 and the deposit 65, i.e., the thickness of the mask layer, gradually decreases. For example, it was observed that the thickness of the mask layer was 620 nm 9 minutes after the process started. At this time, the DT 66 was formed in the silicon base 61 to have the upper opening diameter of 105 nm, the lower opening diameter of 67 nm, and the silicon depth (Si depth) of 755 nm (aspect ratio=8.7).

Subsequently, the wafer W in which the DTs 66 have been formed is introduced in a wet etching apparatus separately provided in the substrate processing system, and the $SiO_2$ layer 62 which serves as a mask layer and the deposits 65 formed on the $SiO_2$ layer 62 are removed at the same time. Then, the process is ended.

In the embodiment, since a mixed gas of $NF_3$ gas, HBr gas, $O_2$ gas, and $SiCl_4$ gas is used as a processing gas, the deposits 65, a reaction product, are formed on the $SiO_2$ layer 62 serving as a mask layer to suppress abrasion of the $SiO_2$ layer 62, thereby enabling the silicon base 61 to be etched while securing the thickness of the mask layer. Further, it may be possible to improve shape controllability of the openings and form the DTs 66 having stable opening shape. In addition, since selectivity and etching rate ("ER") of the silicon layer are enhanced, it is possible to form the DTs 66 having a high aspect ratio.

In this embodiment, the flow rate of $SiCl_4$ gas is preferably set to, for example, about 0.5-3% of the flow rate of the whole processing gases in the deposition etching step. By doing so, the amount of deposits 65 formed on the $SiO_2$ layer 62 serving as a mask layer can be appropriately controlled.

Table 1 shows a dependency on $SiCl_4$ gas flow rate of the thickness of the mask remaining layer and Si depth (silicon depth) in this embodiment.

TABLE 1

| | Example 1 | Example 2 | Example 3 | Example 4 | Comp. Example 1 | Comp. Example 2 |
|---|---|---|---|---|---|---|
| pressure | 250 | 250 | 210 | 250 | 170 | 170 |
| HF | 500 | 500 | 500 | 500 | 900 | 900 |
| LF | 2500 | 2500 | 2500 | 2500 | 1950 | 1950 |
| $NF_3$ gas | 120 | 120 | 120 | 120 | 120 | 120 |
| $O_2$ gas | 163 | 163 | 163 | 163 | 163 | 163 |
| $SiCl_4$ gas | 5(0.5%) | 10 | 20 | 30(3%) | 50 | 0 |
| HBr gas | 700 | 700 | 700 | 700 | 700 | 700 |
| Si depth | 846 | 755 | 692 | 680 | 590 | 794 |
| mask R | 470 | 620 | 943 | 1050 | 1500 | 0 |

Here, the pressure refers to a pressure (mTorr) inside the chamber, and HF and LF refer to excitation electric power (W) and bias electric power (W), respectively, applied to the mounting table. Further, $NF_3$ gas, $O_2$ gas, $SiCl_4$ gas, and HBr gas refer to flow rates (sccm) of the respective gases. In the item of $SiCl_4$ gas, the numbers in the parentheses refer to ratios of the flow rate of the $SiCl_4$ gas with respect to the flow rate of the whole gases. The Si depth refers to a depth (nm) of the DT, and mask R refers to a thickness of the remaining mask layer (nm).

As can be seen from Table 1, the flow rates of $SiCl_4$ gas were 5, 10, 20, and 30 sccm in Examples 1 to 4, respectively. The ratio of the flow rate of $SiCl_4$ gas to the flow rate of the whole processing gases was in the range of 0.5-3% in the Examples 1 to 4, and thus satisfied the requirement of the present invention. Accordingly, it could be possible to form the DTs 66 of a high aspect ratio by etching the silicon layer while securing a good thickness of the mask layer.

In contrast, Comparative Examples 1 and 2 show that the amount of added $SiCl_4$ gas did not meet the requirement of the present invention. According to Comparative Example 1, excessive deposits were formed on the $SiO_2$ layer 62 and the opening area of the openings became too narrow, thus making it impossible to etch the silicon base 61. According to Comparative Example 2, no deposit was formed on the $SiO_2$ layer 62, thus making it impossible to secure the mask layer and etch the silicon base 61.

From Example 2 and Comparative Example 2, it was found that the thickness of the mask layer was increased by adding 10 sccm of $SiCl_4$ gas to the processing gas. In Example 2, it could be possible to appropriately secure a thickness of the mask layer to have the DTs 66 deeper in comparison with Comparative Example 2.

In this embodiment, it is not clear why a thickness of the mask layer may be maintained to obtain a deeper trench by adding $SiCl_4$ gas to the processing gas, however, the following inference can be made. In a step of etching a silicon layer using a mixed gas of $NF_3$ gas, HBr gas, and $O_2$ gas as a processing gas, a by-product from a chemical etching reaction is a SiO-based material, for example, $SiO_2$ or $SiO_2$+ halogen. Accordingly, an addition of $SiCl_4$ gas to the reaction system substitutes Cl of $SiCl_4$ for O, thus generating SiClO similar in chemical equation to $SiO_2$ of the $SiO_2$ layer serving as a mask layer. SiClO is prone to be deposited on the $SiO_2$ layer, so that abrasion of the mask layer is reduced and resultantly the thickness of the mask layer is increased, thus obtaining a deeper DT in the etching.

By adding $O_2$ gas together with $SiCl_4$ gas, the amount of deposits formed on the $SiO_2$ layer 62 can be increased. It is believed that the addition of $O_2$ gas accelerates decomposition of $SiCl_4$ and generation of SiClO. The amount of $O_2$ gas added is about 1-3% of the flow rate of the whole gases, and preferably substantially identical to the flow rate of $SiCl_4$ gas. By doing so, the formation of the deposit 65 on the $SiO_2$ layer 62 is accelerated, thus increasing the thickness of the mask layer and the silicon depth. If the amount of $O_2$ gas added exceeds 3% of the flow rate of the whole gases, the increase of the deposit 65 may cause the opening area of the hole opening to be excessively small to the extent that etching the silicon base 61 is impossible. Further, if the amount of $O_2$ gas added is lower than 1% of the flow rate of the whole gases, it is impossible to acquire an effect of sufficiently increasing the amount of deposits.

In this embodiment, the reason why stability of opening shape is enhanced is believed as follows. Since in the deposition etching step, the etching of the silicon base 61 is performed while the deposits 65 are deposited on the $SiO_2$ layer 62 serving as the mask layer, the silicon base 61 is not etched as quick as may deform the shape of the opening, but rather slowly etched while maintaining the original shape of the opening.

In this embodiment, the pressure inside the chamber preferably ranges from about 40 mTorr (5.32 Pa) to about 300 mTorr (3.99×10 Pa), and more preferably, from about 150 mTorr (2.00×10 Pa) to about 250 mTorr (3.33×10 Pa). If the pressure inside the chamber is lower than 40 mTorr (5.32 Pa), selectivity of $SiO_2$ is lowered, while if the pressure is more than 300 mTorr (3.99×10 Pa), the hole comes to be filled with a reaction product. Accordingly, in this embodiment, the pressure inside the chamber is set to about 40 mTorr (5.32 Pa) to 300 mTorr (3.99×10 Pa).

Other conditions than the above-mentioned conditions may be applicable in this embodiment as long as the flow rate, processing time, and processing pressure of the processing gas may be changed variously and the amount of the deposits 65 formed on the $SiO_2$ layer 62 may be appropriately maintained.

In this embodiment, $SiBr_4$ gas may be used instead of $SiCl_4$ gas. It is believed that $SiBr_4$ gas can also accelerate the formation of deposits similarly to $SiCl_4$ gas.

A second embodiment of the present invention will now be described.

FIG. 5 depicts processes included in a substrate processing method according to the second embodiment of the present invention. This embodiment includes an etching step and a deposition step that are alternately repeatedly performed. In the etching step, a silicon layer is etched by using plasma generated from a processing gas for etching. In the deposition step, deposits are deposited on the surface of a mask layer by using plasma generated from a processing gas for deposition.

Figure 5A:
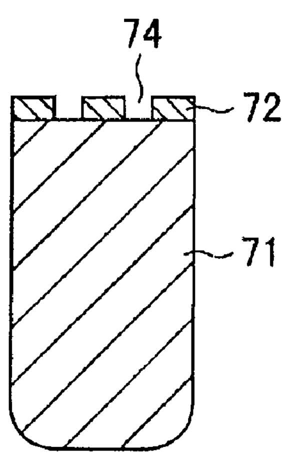
FIGS. 5A to 5G depict processes included in a substrate processing method according to a second embodiment of the present invention.

Referring to FIG. 5A, a wafer W is prepared that includes a silicon layer 71, a target layer to be processed, and an $SiO_2$ layer 72 that serves as a mask layer and is laminated on the silicon layer 71. The $SiO_2$ layer 72 has openings 74, whose width is, for example, 80 nm. The thickness of the $SiO_2$ layer 72 is in a range of, e.g., 1000-1500 nm. The wafer W is loaded in the chamber 42 of the process module 25 (refer to FIG. 2) and mounted on the mounting table 43.

Subsequently, the pressure inside the chamber 42 is set to, for example, about 170 mTorr (2.26×10 Pa) to 250 mTorr (3.33×10 Pa), by the APC valve 46 or the like. Further, the temperature of the wafer W is set to, for example, about 90° C. And, a mixed gas of $NF_3$ gas as a fluorine-based gas, HBr gas as a bromine-based gas, and $O_2$ gas is supplied from the gas supply unit 50 of the shower head 44 to the chamber 42. At this time, for example, the flow rates of $NF_3$ gas, HBr gas, $O_2$ gas are set to about 120 sccm, 700 sccm, and 163 sccm, respectively.

Figure 5B:
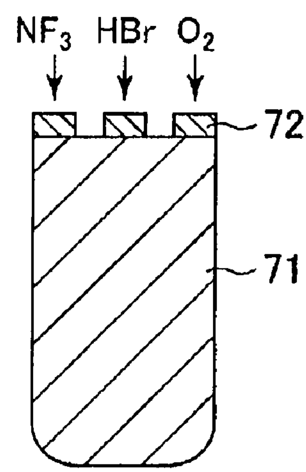
Figure 5C:
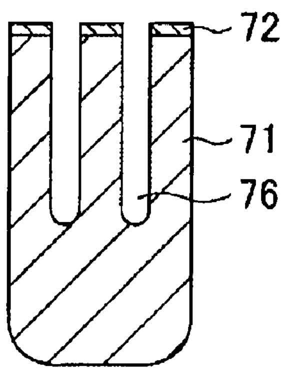

Then, excitation electric power of 500 W and bias electric power of 2500 W are applied to the mounting table 43. $NF_3$ gas, HBr gas, and $O_2$ gas are excited by the high-frequency power applied to the processing space S to be converted into plasma, thus generating ions and/or radicals as shown in FIG. 5B. As shown in FIG. 5C, the ions and/or radicals collide and react with the surface of the $SiO_2$ layer 72 to etch and abrade the $SiO_2$ layer 72. Simultaneously, the ions and radicals collide with the silicon layer 71 not covered by the $SiO_2$ layer 72 to etch the silicon layer 71, thus forming a trench 76 in the silicon layer 71 ("etching step"). At this time, the Si depth of the trench 76 was in the range of about 300-500 nm.

Thereafter, a deposition step is conducted on the wafer W in which the $SiO_2$ layer 72 has been abraded to some degree and the trench 76 has been formed on the silicon layer 71.

More specifically, the pressure inside the chamber 42 of the process module 25 in which the wafer W that has been subjected to the etching step is included is set to about 300 mTorr (3.99×10 Pa) by the APC valve 46 and a mixed gas of HBr gas as a bromine-based gas, $O_2$ gas and $SiCl_4$ gas is supplied from the gas supply unit 50 of the shower head 44 into the chamber 42. In this case, for example, the flow rates of HBr gas, $O_2$ gas, $SiCl_4$ gas are set to about 300 sccm, 30 sccm, 15 sccm, respectively. If necessary, Ar gas may be added.

Figure 5D:
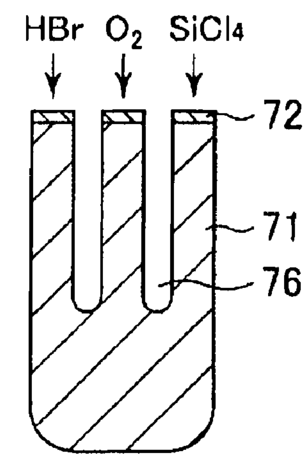
Figure 5E:
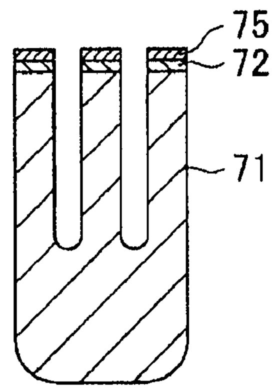
Figure 5F:
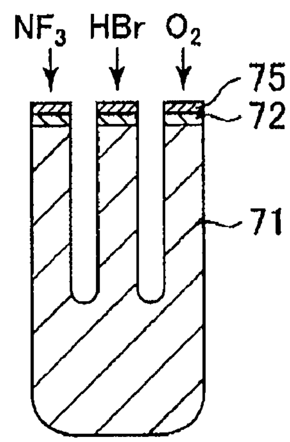

Then, excitation electric power of 500 W and bias electric power of 0 W are applied to the mounting table 43. At this time, HBr gas, $O_2$ gas, and $SiCl_4$ gas are excited by the high-frequency power applied to the processing space S to be converted into plasma, thus generating ions and/or radicals as shown in FIG. 5D. As shown in FIG. 5E, the ions and/or radicals collide and react with the surface of the $SiO_2$ layer 72 to deposit the deposits 75 as a reaction product, thereby increasing the apparent thickness of the mask layer including the $SiO_2$ layer 72 ("deposition step").

Figure 5G:
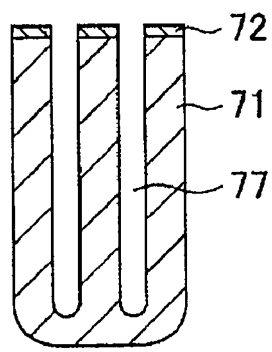

Under the same conditions as those in the etching step (refer to FIG. 5B), the same plasma is generated (refer to FIG. 5F) to perform the etching step in a similar manner. Thereafter, the etching step using $NF_3$ gas, HBr gas, and $O_2$ gas, and the deposition step using HBr gas, $O_2$ gas, and $SiCl_4$ gas are sequentially repeated to etch the silicon layer 71 to form a DT 77 on the silicon layer 71 while securing a thickness of the $SiO_2$ layer 72, as shown in FIG. 5G.

The Si depth of the DT 77 was in the range of about 300-500 nm. Subsequently, a wet etching is performed to eliminate the $SiO_2$ layer 72 similarly to the first embodiment and then the process is ended.

This embodiment includes the etching step that etches the silicon layer 71 by plasma generated from the processing gas for etching and the deposition step that forms the deposit 75 on the surface of the $SiO_2$ layer 72 serving as a mask layer by plasma generated from the processing gas for deposition. The etching step and the deposition step are repeatedly performed, thereby allowing for improvement in selectivity and enabling the etching while securing a thickness of the mask layer. Accordingly, the DT 77 of a high aspect ratio may be obtained on the silicon layer 71.

In this embodiment, the pressure inside the chamber is preferably set to about 40 mTorr (5.32 Pa) to 300 mTorr (3.99×10 Pa), and more preferably, about 150 mTorr (2.0×10 Pa) to 300 mTorr (3.99×10 Pa). If the pressure inside the chamber is lower than 40 mTorr (5.32 Pa), selectivity of $SiO_2$ is lowered, while if the pressure is more than 300 mTorr (3.99×10 Pa), the hole comes to be filled with a reaction product.

According to this embodiment, the flow rate of $O_2$ gas is preferably about 10 to 50 sccm, i.e., about 1.5 to 7.5% of the flow rate of the whole gases. If the flow rate of $O_2$ gas deviates from the above range, the amount of the deposits 75 increases to clog the opening, thus making it impossible to etch the silicon layer 71, or the amount of the deposits 75 is excessively small to cause the $SiO_2$ layer 72 to disappear, thus making it impossible to etch the silicon layer 71.

According to this embodiment, the flow rate of $SiCl_4$ gas is preferably about 5 to 30 sccm, i.e., about 0.8 to 4.5% of the flow rate of the whole gases in the deposition step. If the flow rate of $SiCl_4$ gas deviates from the above range, the amount of the deposits 75 increases to clog the opening, thus making it impossible to etch the silicon layer 71, or the amount of the deposits 75 is excessively small to cause the $SiO_2$ layer 72 to disappear, thus making it impossible to etch the silicon layer 71.

Table 2 shows a dependency on a processing time of increase in thickness of the mask layer in the deposition step according to this embodiment.

TABLE 2

| | Example 5 | Example 6 | Example 7 | Example 8 |
|---|---|---|---|---|
| Pressure | 300 | 300 | 300 | 300 |
| HF | 500 | 500 | 500 | 500 |
| HBr gas | 300 | 300 | 300 | 300 |
| $O_2$ gas | 30 | 30 | 30 | 30 |
| Ar gas | 300 | 300 | 300 | 300 |
| $SiCl_4$ gas | 5.0(0.8) | 7.5(1.2) | 15(2.3) | 30(4.5) |
| Mask layer increment(15 sec) | 10 | 18 | 30 | 60 |
| Mask layer increment(30 sec) | 20 | 35 | 70 | 120 |
| Mask layer increment(60 sec) | 40 | 80 | 130 | 123 |

Here, the pressure refers to a pressure (mTorr) inside the chamber, and HF refers to excitation electric power (W) applied to the mounting table. Further, HBr gas, $O_2$ gas, and $SiCl_4$ gas refer to flow rates (sccm) of the respective gases. In the item of $SiCl_4$ gas, the numbers in the parentheses refer to ratios of $SiCl_4$ gas with respect to the flow rate of the whole gases. Further, the mask layer increment refers to an increment (mm) in thickness of the mask layer with lapse of time from the initiation of the deposition step.

It can be seen in Table 2 that the amount of the deposit 75 increases as the flow rate of $SiCl_4$ gas increases in the range of 5 to 30 sccm until the processing time reaches about 60 seconds. If the processing time exceeds 60 seconds, however, the increase in the amount of the deposits reaches a limitation (refer to Example 8). Accordingly, the processing time in the deposition step is preferably set to 15-60 seconds.

It can also be seen in Table 2 that the amount of the deposits is well increased when the flow rate of $SiCl_4$ gas is in the range of 5-30 sccm. The flow rate of $SiCl_4$ gas is preferably set, for example, about 0.8-4.5% of the flow rate of the whole gases.

According to this embodiment, the etching rate ("ER") can be improved up to 900 A/min in the etching step. However, if the ER is higher than 900 A/min, the opening may be clogged, thus making it impossible to perform subsequent etching.

The substrate subjected to a plasma processing according to the embodiments of the present invention is not limited to a wafer for semiconductor devices, but may include various substrates used for LCDs (Liquid Crystal Displays), FPD (Flat Panel Displays), or so, or photomasks, CD substrates, print substrates or the like.

Moreover, the object of the present invention may be also achieved by a storage medium storing program codes of software for implementing the functions of the above-mentioned embodiments, which is supplied to a system or device whose computer (or CPU or MPU) may read and execute the program codes stored in the storage medium.

In this case, the program codes themselves, which are read from the storage medium, realize the functions of the above-described embodiments, and the program codes and the storage medium storing the program codes configure the present invention.

Further, the storage medium for supplying program codes may include, for example, floppy discs (registered trademark), hard discs, magneto-optical discs, optical discs, such as CD-ROM, CD-R, CD-RW, DVD-ROM, DVD-RAM, DVD-RW, and DVD+RW, magnetic tapes, non-volatile memory cards, and ROMs. Or, the program codes may be downloaded over a network.

The functions of each of the above-described embodiments may be implemented by executing the program codes read by the computer, or by actual processes a part or all of which is executed by OS (Operating System) operating in the computer based on commands of the program codes.

The program codes read from the storage medium may be recorded in a memory provided in a function extension board inserted in the computer or a function extension unit connected to the computer. The functions of the above-described embodiments may be implemented by actual processes a part or all of which is executed by a CPU provided in the extension board or extension unit based on commands of the program codes.

The substrate processing method in accordance with the embodiments of the present invention includes a deposition etching step of etching the silicon layer while depositing a deposit on a surface of the oxide layer by a plasma generated from a mixed gas of a fluorine-based gas, a bromine-based gas, $O_2$ gas, and $SiCl_4$ gas to secure a thickness of the mask layer. Accordingly, selectivity in etching the silicon layer can be enhanced and DTs of a high aspect ratio can be obtained. In particular, it is possible to form DTs with enhanced controllability of opening shape and stable opening shape.

Further, a flow rate of $SiCl_4$ is adjusted to about 0.5-3% of a flow rate of the whole processing gases. Accordingly, it is possible to properly adjust the amount of deposits on the mask layer.

Alternatively, the substrate processing method may include an etching step of etching the silicon layer by a plasma generated from a mixed gas of a fluorine-based gas, a bromine-based gas, and $O_2$ gas; and a deposition step of depositing a deposit on a surface of the oxide layer by a plasma generated from a mixed gas of bromine-based gas, $O_2$ gas, and $SiCl_4$ gas, wherein the etching step and the deposition step are alternately repeatedly performed. Accordingly, selectivity in etching the silicon layer can be enhanced and the silicon layer can be etched while securing a thickness of the mask layer, thus obtaining DTs of a high aspect ratio. In particular, it is possible to increase the amount of deposits to secure a thickness of the mask layer.

Further, in the deposition step, a flow rate of $SiCl_4$ gas is adjusted to be about 0.8-4.5% of a flow rate of the whole processing gases. Accordingly, the silicon layer can be etched to form DTs while suppressing abrasion of the mask layer within a proper range.

Moreover, a processing time of the etching step is about 30-180 seconds and a processing time of the deposition step is about 15-60 seconds. Accordingly, it is possible to form DTs on the silicon layer while securing a thickness of the mask layer and controlling the etching of the silicon layer.

In addition, in the deposition etching step and the deposition step, $O_2$ gas is added to accelerate the deposition of the deposit. Accordingly, it is possible to sufficiently secure the amount of deposits to suppress abrasion of the mask layer.

Furthermore, the processing of the substrate is performed in an airtight chamber containing the substrate therein, and in the deposition etching step and the deposition step, a pressure inside the airtight chamber is adjusted to be about 40 mTorr (5.32 Pa)–300 mTorr ($3.99\times10$ Pa). Accordingly, it is possible to efficiently etch the silicon layer while securing a thickness of the mask layer under a proper pressure.

Further, the oxide layer is an $SiO_2$ layer. Accordingly, when $SiCl_4$ gas is added to the processing gas, deposits having a similar chemical structure to that of the $SiO_2$ layer are prone to be formed on the $SiO_2$ layer, thus suppressing abrasion of the mask layer.

Besides, the fluorine-based gas is $NF_3$ gas and the bromine-based gas is HBr gas. Accordingly, the etching of the silicon layer can be well performed by such gases.

While the invention has been shown and described with respect to the embodiments, it will be understood by those skilled in the art that various changes and modifications may be made without departing from the scoped of the invention as defined in the following claims.

What is claimed is:

1. A substrate processing method of processing a substrate that includes an oxide layer as a mask layer and a silicon layer as a target layer to be processed, the method comprising:

etching the silicon layer while depositing a deposit on a surface of the oxide layer by a plasma generated from a mixed gas of a fluorine-based gas, a bromine-based gas, $O_2$ gas, and $SiCl_4$ gas to secure a thickness of the mask layer, wherein a flow rate of the $SiCl_4$ gas is adjusted to about 0.5-3% of a flow rate of the whole mixed processing gases to thereby suppress the deposit from being deposited on a side surface of the etched silicon layer, wherein the oxide layer is an $SiO_2$ layer, and wherein the bromine-based gas is HBr gas.

2. The substrate processing method of claim 1, wherein in the etching, $O_2$ gas is added to accelerate deposition of the deposit.

3. The substrate processing method of claim 1, wherein the processing of the substrate is performed in an airtight chamber containing the substrate therein, and wherein in the etching, a pressure inside the airtight chamber is adjusted to be about 40 mTorr (5.32 Pa)–300 mTorr ($3.99\times10$ Pa).

4. The substrate processing method of claim 1, wherein the fluorine-based gas is $NF_3$ gas.

5. The substrate processing method of claim 1, wherein the mask layer is formed only of $SiO_2$ layer.

6. A substrate processing method of processing a substrate that includes an oxide layer as a mask layer and a silicon layer as a target layer to be processed, the method comprising:

etching the silicon layer by a plasma generated from a mixed gas of a fluorine-based gas, a bromine-based gas, and $O_2$ gas; and depositing a deposit on a surface of the oxide layer by a plasma generated from a mixed gas of a bromine-based gas, $O_2$ gas, and $SiCl_4$ gas, wherein the etching and the depositing are alternately repeatedly performed, wherein in the depositing, a flow rate of the $SiCl_4$ gas is adjusted to be about 0.8-4.5% of a flow rate of the whole mixed processing gases to thereby suppress the deposit from being deposited on a side surface of the etched silicon layer, wherein the oxide layer is an $SiO_2$ layer, and wherein the bromine-based gas is HBr gas.

7. The substrate processing method of claim 6, wherein a processing time of the etching is about 30-180 seconds and a processing time of the depositing is about 15-60 seconds.

8. The substrate processing method of claim 4, wherein a processing time of the etching is about 30-180 seconds and a processing time of the depositing is about 15-60 seconds.

9. The substrate processing method of claim 6, wherein in the depositing, $O_2$ gas is added to accelerate deposition of the deposit.

10. The substrate processing method of claim 6, wherein the processing of the substrate is performed in an airtight chamber containing the substrate therein, and wherein in the depositing, a pressure inside the airtight chamber is adjusted to be about 40 mTorr (5.32 Pa)–300 mTorr ($3.99\times10$ Pa).

11. The substrate processing method of claim 6, wherein the fluorine-based gas is $NF_3$ gas.

12. The substrate processing method of claim 6, wherein the mask layer is formed only of $SiO_2$ layer.

* * * * *